United States Patent
Kao

(10) Patent No.: US 10,755,789 B1
(45) Date of Patent: Aug. 25, 2020

(54) WRITE PROTECTION CIRCUIT

(71) Applicant: INNODISK CORPORATION, New Taipei (TW)

(72) Inventor: Chih-Chieh Kao, New Taipei (TW)

(73) Assignee: Innodisk Corporation, New Taipei (TW)

( * ) Notice: Subject to any disclaimer, the term of this patent is extended or adjusted under 35 U.S.C. 154(b) by 0 days.

(21) Appl. No.: 16/532,871

(22) Filed: Aug. 6, 2019

(30) Foreign Application Priority Data

Apr. 19, 2019 (TW) .............................. 108113817 A

(51) Int. Cl.
 *G11C 16/22* (2006.01)
 *G11C 7/24* (2006.01)

(52) U.S. Cl.
 CPC ................ *G11C 16/22* (2013.01); *G11C 7/24* (2013.01)

(58) Field of Classification Search
 CPC ............ G11C 17/00; G11C 16/22; G11C 7/24
 USPC ........................................................ 365/195
 See application file for complete search history.

(56) References Cited

U.S. PATENT DOCUMENTS

| 6,829,672 B1* | 12/2004 | Deng | G06F 3/0605 711/103 |
| 2002/0169022 A1* | 11/2002 | Canterbury | G07F 17/3223 463/29 |
| 2016/0004463 A9* | 1/2016 | Deng | G06F 3/0679 711/103 |
| 2016/0260494 A1* | 9/2016 | Cao | G11C 16/22 |

* cited by examiner

*Primary Examiner* — Harry W Byrne
(74) *Attorney, Agent, or Firm* — Rosenberg, Klein & Lee

(57) ABSTRACT

The invention provides a write protection circuit, which is applied to a data storage device. The data storage device comprises a controller and a plurality of flash memories. The flash memories comprise a write protection pin. The write protection circuit comprises a fuse and a switch. When the switch is operated in a turned on state, the fuse is directly grounded via the switch and therefore is burned, and a signal on the write protection pin of the flash memories becomes a signal with a low-level state so that the flash memories of the data storage device will be permanently inhibited to be written.

10 Claims, 3 Drawing Sheets

WRITE PROTECTION CIRCUIT

This non-provisional application claims priority claim under 35 U.S.C. § 119(a) on Taiwan Patent Application No. 108113817 filed Apr. 19, 2019, the entire contents of which are incorporated herein by reference.

FIELD OF THE INVENTION

The present invention relates to a write protection circuit, more particularly, to a write protection circuit applied to a data storage device.

BACKGROUND

In order to protect data, nowadays, data storage device can be disposed with a means of write protection. By the means of write protection, the important data in the data storage device can prevent to be infected by a virus or overwritten.

In the means of previous write protection, a physical write protection switch (WP switch) is disposed on a side of a housing of the data storage device, for example, memory card. It can be decided whether the data storage device is allowed to be written by switching the position of the WP switch.

Alternatively, a write protection function is disposed in a firmware of a controller of the data storage device. When a host wants to perform a write protection process for the data storage device, it may send a WP # command to the data storage device. After the controller of the data storage device receives the WP # command, the write protection process will be started according to the WP # command, so that the data can be inhibited to write into the data storage device.

Different from the means of the previous two write protection, the present invention provides a novelty write protection circuit applied to the data storage device, the write protection circuit of the present invention is having a means of unrecoverable write protection, the data storage device will be permanently inhibited to be written when the unrecoverable write protection of the write protection circuit is be started, which is the object to be achieved by the present invention.

SUMMARY

It is one objective of the present invention to provide a write protection circuit, which is applied to a data storage device having a plurality of flash memories, when the flash memories of the data storage device stores some important data, the user can perform an unrecoverable write protection process for the flash memories of the data storage device, so that the flash memories of the data storage device can be permanently inhibited to be written, and the important data in the flash memories of the data storage device can prevent to be infected by a virus or overwritten.

It is another objective of the present invention to provide a write protection circuit, which is applied to a data storage device having a plurality of flash memories, the flash memories comprises a write protection pin, the write protection circuit comprises a fuse and a switch, the fuse is connected between a power supply and the switch; when the write protection circuit is started, the switch is operated in a turned on state, the write protection pin of the flash memories is connected to a ground via the switch, and a state of a signal on the write protection pin will be pulled down to a low-level state by the ground and therefore the flash memories are unable to be written; furthermore, the fuse is grounded via the switch when the switch is operated in the turned on state, a large current will flow through the fuse to cause the fuse to be overloaded and burned, and thus a connection line between the power supply and the write protection pin of the flash memories will form an open circuit, so that the state of the signal on the write protection pin can only will only be kept in the low-level state always, and the flash memories of the data storage device will be permanently inhibited to be written.

To achieve the above objective, the present invention provides a write protection circuit, which is applied to a data storage device, wherein the data storage device comprises a controller and a plurality of flash memories, the controller is connected to the flash memories, the flash memories comprise a write protection pin, the write protection circuit comprising: a fuse, connected between a power supply and a first connection point; a switch, connected between the first connection point and a ground; and a first resistor, connected between the first connection point and the write protection pin; wherein the fuse is burned when the switch is operated in a turned on state, a state of a signal on the write protection pin is in a low-level state, and the flash memories will be permanently inhibited to be written.

In one embodiment of the present invention, the controller of the data storage device is connected to the switch, when the controller receives a write protection command, the controller controls the switch to operate in the turned on state according to the write protection command.

In one embodiment of the present invention, the data storage device is connected to a host, and the write protection command is issued by the host.

In one embodiment of the present invention, the controller of the data storage device is connected to a physical switch element and a switch, when the physical switch element is actuated, the controller controls the switch to operate in the turned on state.

In one embodiment of the present invention, the controller comprises an input and output pin, the physical switch element is connected to the input and output pin of the controller, when the physical switch element is actuated, a state of a signal on the input and output pin is in a low-level state, the controller controls the switch to operate in the turned on state according to the signal with the low-level state on the input and output pin.

In one embodiment of the present invention, the controller comprises a firmware, the firmware set a time threshold, when a time of actuation of the physical switch element has exceeded the time threshold, the controller sends an enable signal to the switch to control the switch to operate in the turned on state.

In one embodiment of the present invention, wherein the physical switch element is a push button switch, a touch switch or a dip switch.

In one embodiment of the present invention, the switch is a transistor.

In one embodiment of the present invention, the switch is a physical switch element, the switch is operated in the turned on state when the switch is actuated.

In one embodiment of the present invention, the switch is connected to a second resistor in parallel.

DETAILED DESCRIPTION OF THE PREFERRED EMBODIMENTS

Figure 1:
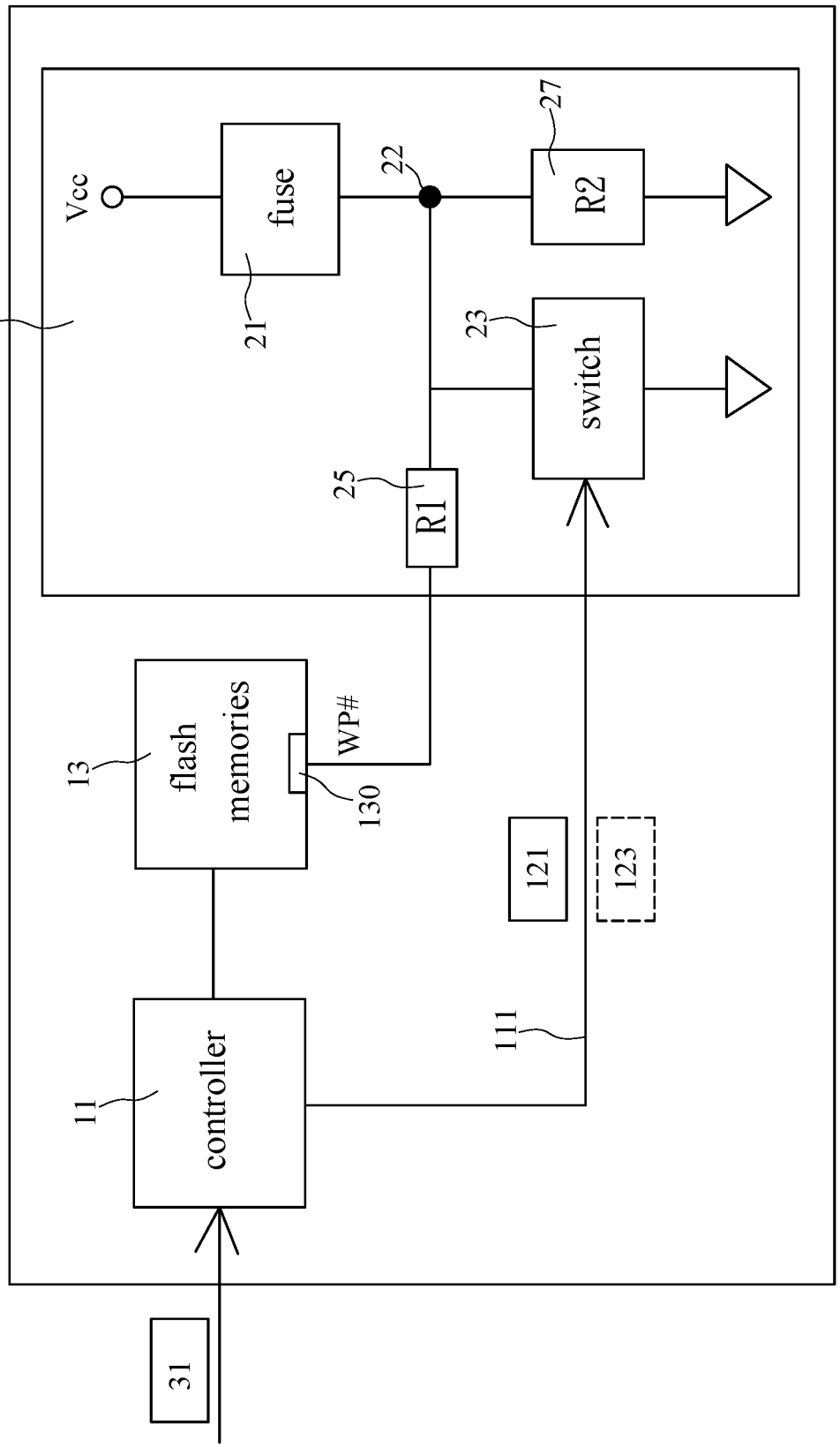
FIG. 1 is a circuit diagram of a write protection circuit applied to a data storage device according to one embodiment of the present invention.

Referring to FIG. 1, there is shown a circuit diagram of a write protection circuit applied to a data storage device according to one embodiment of the present invention. As shown in FIG. 1, the write protection circuit 200 of the present embodiment is applied to a data storage device 100. The data storage device 100 can also be a solid state drive (SSD) or a memory card. The data storage device 100 comprises a controller 11 and a plurality of flash memories 13. The controller 11 is connected to the flash memories 13. The flash memories 13 comprise a write protection pin 130. The write protection pin 130 is a controlling pin used to decide whether the flash memories 13 are allowed to be written. For example, when a state of a signal (WP #) on the write protection pin 130 is in a high-level state, the flash memories 13 allow to be written; when the signal (WP #) on the write protection pin 130 is in a low-level state, the flash memories 13 are inhibited to be written.

The write protection circuit 200 comprises a fuse 21, a switch 23, and a first resistor 25. The fuse 21 is connected between a power supply (VCC) and a first connection point 22, the switch 23 is connected between the first connection point 22 and a ground, and the first resistor 25 is connected between the first connection point 22 and the write protection pin 130 of the flash memories 13. The controller 11 of the data storage device 100 can be connected to the switch 23 through a first connection line 111, such as a general purpose input/output (GPIO) connection line, and used for controlling the switch 23 to operate in a turned on state or a turned off state. In the present embodiment, the switch 24 is a MOS transistor or a bipolar transistor.

Further, the data storage device 100 of the present embodiment is connected to a host, which is not shown. For example, the data storage device 100 is connected to the host by SATA, PCIe, or USB transmission interface. When the data storage device 100 is operated in a normal read/write mode, the controller 11 sends a disable signal 121 to the switch 23, the switch 23 will be controlled to operate in the turned off state according to the disable signal 121, the signal (WP #) on the write protection pin 130 will be pulled up to a high-level state by VCC, the data storage device 100 allows that the host writes data to the flash memories 13. When the data storage device 100 desires to operate in a write protection mode, the host sends a customized write protection command 31 to the data storage device 100. After receiving the customized write protection command 31, the controller 11 of the data storage device 100 starts a write protection process and sends an enable signal 123 to the he switch 23, the switch 23 will be controlled to operate in the turned on state according to the enable signal 123, the state of the signal (WP #) on the write protection pin 130 will be pulled down to a low-level state by the ground so that the flash memories 13 of the data storage device 100 will be inhibited to be written. Besides, when the fuse 21 is directly electrically grounded via the switch 23 operated in the turned on state, a large current will flow through the fuse 21 to cause the fuse 21 to be overloaded and burned, and therefore a connection line between VCC and the write protection pin 130 of the flash memories 13 will form an open circuit. Afterwards, the state of the signal (WP #) on the write protection pin 130 will only be kept in the low-level state forever, so that the flash memories 13 of the data storage device 100 will be permanently inhibited to be written.

Besides, the write protection circuit 200 further comprises a second resistor 27. The second resistor 27 is connected between the first connection point 22 and the ground, and connected to the switch 23 in parallel. The resistance value of the second resistor 27 is much larger than the resistance value of the first resistor 25. By the disposition of the second resistor 27, the electrical signal on the memory cells of the flash memories 13 can be grounded via the second resistor 27, so that the memory cells of the flash memories 13 can be prevented to be connected in floating, and therefore the correctness of reading data in the memory cells of the flash memories 13 can be ensured.

Figure 2:
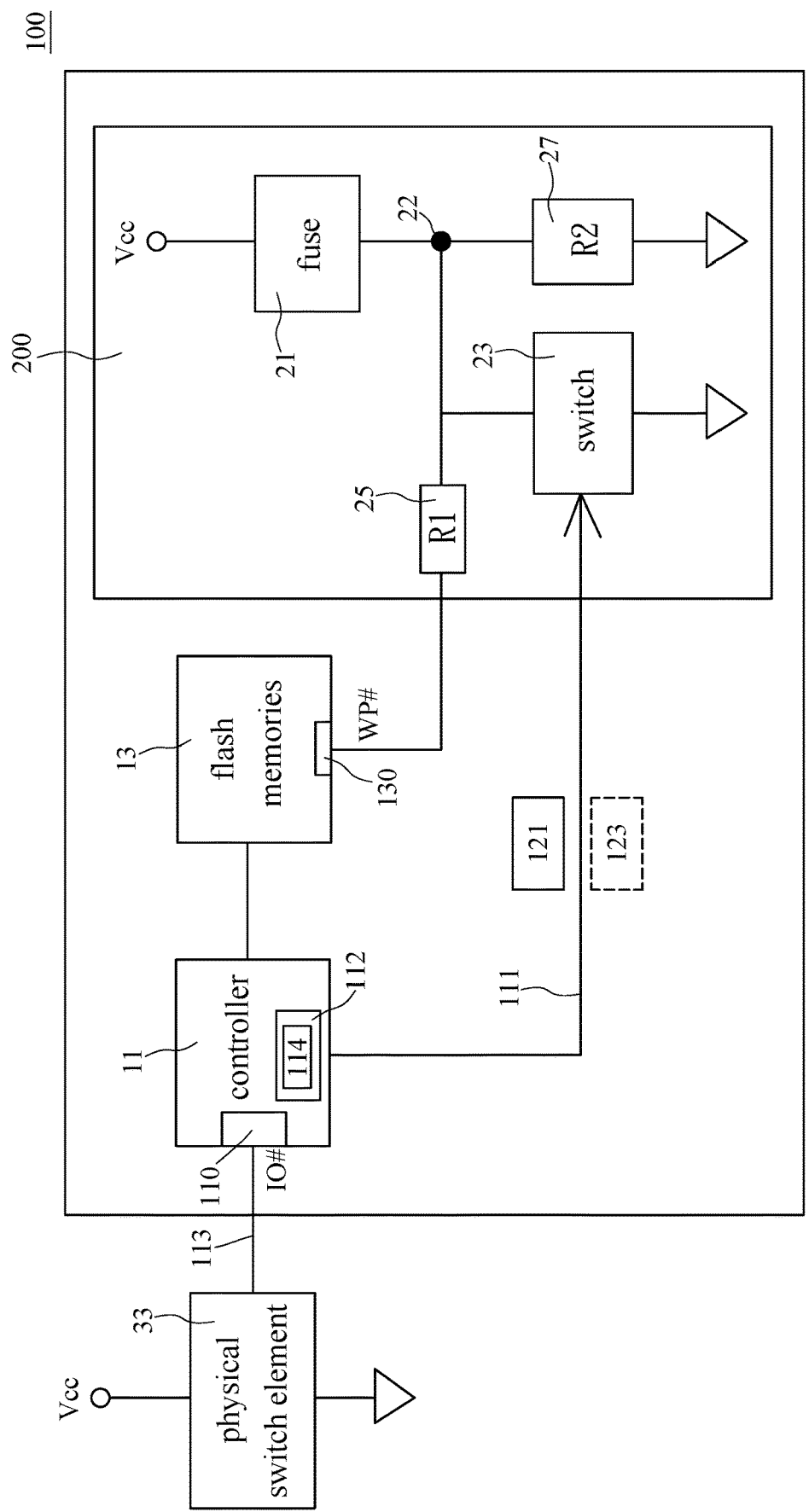
FIG. 2 is a circuit diagram of a write protection circuit applied to a data storage device according to another embodiment of the present invention.

Referring to FIG. 2, there is shown a circuit diagram of a write protection circuit applied to a data storage device according to another embodiment of the present invention. The write protection process of the write protection circuit 200 of the above embodiment is started by a customized write protection command 31, and the write protection process of the write protection circuit 200 of the present embodiment is started by a physical switch element.

As shown in FIG. 2, the controller 11 of the data storage device 100 comprises an input and output pin 110. An external physical switch element 33 is connected to the input and output pin 110 of the controller 11 by a second connection line 113, such as a GPIO connection line. The physical switch element 33 is a push button switch, a touch switch or a dip switch.

When the user desires to start the write protection process of the data storage device 100, he can actuate the physical switch member 33, such as pressing or dialing the physical switch element 33. After the physical switch member 33 has actuated, a state of a signal (IO #) on the input and output pin 110 will be turned into a low-level state. The controller 11 controls the switch 23 to operate in turned on state according to the signal (IO #) with the low-level state on the input and output pin 110. Then, the state of the signal (WP #) on the write protection pin 130 is pulled down to the low-level state according to the switch 23 operate in turned on state so that the fuse 21 is overloaded and burned, and the flash memories 13 of the data storage device 100 will be permanently inhibited to be written.

The controller 11 of the data storage device 100 further comprises a firmware 112. The firmware 112 sets a time threshold 114. The controller 11 of the present embodiment can be used for detecting a time of actuation of the physical switch element 33, for example, the controller 11 counts a continued time that the state of the signal (IO #) is in the low-level state by the use of a counter. When the time of actuation of the physical switch element 33 has exceeded the time threshold 114, the controller 11 will send the enable signal 123 to the switch 23 so as to start the write protection process of the write protection circuit 200. Accordingly, by the setting of the time threshold 114, it can avoid to start the unrecoverable write protection when the user accidentally touches the physical switch element.

Figure 3:
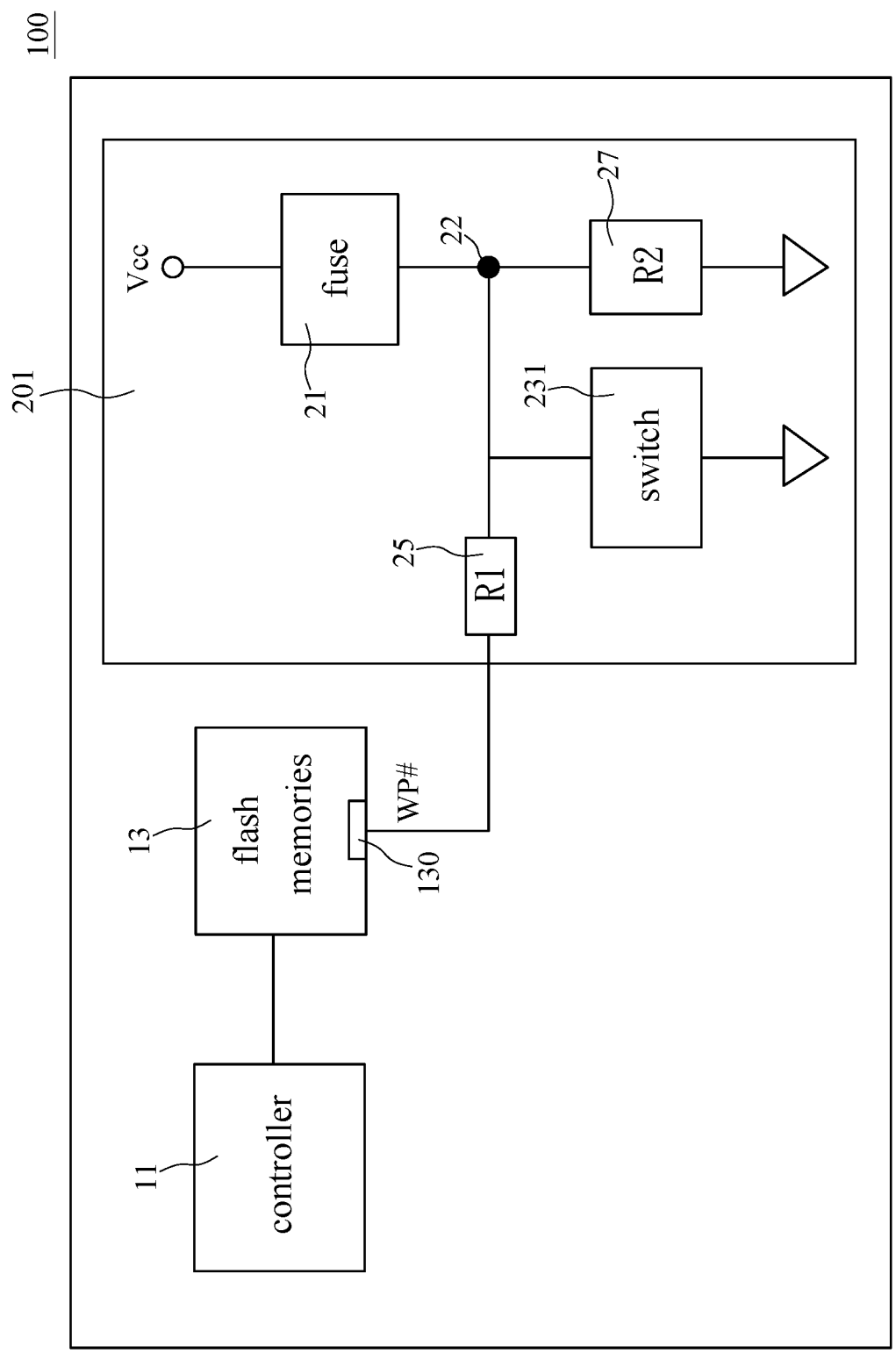
FIG. 3 is a circuit diagram of a write protection circuit applied to a data storage device according to another embodiment of the present invention.

Referring to FIG. 3, there is shown a circuit diagram of a write protection circuit applied to a data storage device according to another embodiment of the present invention. As shown in FIG. 3, the circuit architecture of the write protection circuit 201 is similar the circuit architecture of the write protection circuit 200, the difference between the two is that the switch 231 of the write protection circuit 201 is not connected to the controller 11 of the data storage device 100, and the switch 231 is a physical switch element, for example, a push button switch, a touch switch or a dip switch.

When the user desires to start the write protection process of the data storage device 100, the switch 231 can enter a turned on state by an action of pressing or dialing the switch 231. Afterwards, the state of the signal (WP #) on the write protection pin 130 is pulled down to the low-level state by the switch 231 operated in turned on state to cause the fuse 21 being overloaded and burned, so that the flash memories 13 of the data storage device 100 will be permanently inhibited to be written.

As the above described, when the flash memories 13 of the data storage device 100 stores some important data, for example, system data or confidential data, the user can perform an unrecoverable write protection process for the flash memories 13 of the data storage device 100. After the unrecoverable write protection process is performed, the flash memories 13 of the data storage device 100 can be permanently inhibited to be written, and thus the important data in the flash memory 13 may prevent to be infected by a virus or overwritten.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

What is claimed is:

1. A write protection circuit, which is applied to a data storage device, wherein the data storage device comprises a controller and a plurality of flash memories, the controller is connected to the flash memories, and the flash memories comprise a write protection pin, the write protection circuit comprising:
    a fuse, connected between a power supply and a first connection point;
    a switch, connected between the first connection point and a ground; and
    a first resistor, connected between the first connection point and the write protection pin;
    wherein the fuse is burned when the switch is operated in a turned on state, a state of a signal on the write protection pin is in a low-level state, and the flash memories will be permanently inhibited to be written.

2. The write protection circuit according to claim 1, wherein the controller of the data storage device is connected to the switch, when the controller receives a write protection command, the controller controls the switch to operate in the turned on state according to the write protection command.

3. The write protection circuit according to claim 2, wherein the data storage device is connected to a host, and the write protection command is issued by the host.

4. The write protection circuit according to claim 1, wherein the controller of the data storage device is connected to a physical switch element and a switch, respectively, when the physical switch element is actuated, the controller will control the switch to operate in the turned on state.

5. The write protection circuit according to claim 4, wherein the controller comprises an input and output pin, the physical switch element is connected to the input and output pin of the controller, when the physical switch element is actuated, a state of a signal on the input and output pin is in a low-level state, the controller controls the switch to operate in the turned on state according to the signal with the low-level state on the input and output pin.

6. The write protection circuit according to claim 5, wherein the controller comprises a firmware, the firmware set a time threshold, when a time of actuation of the physical switch element has exceeded the time threshold, the controller sends an enable signal to the switch to control the switch to operate in the turned on state.

7. The write protection circuit according to claim 4, wherein the physical switch element is a push button switch, a touch switch or a dip switch.

8. The write protection circuit according to claim 1, wherein the switch is a transistor.

9. The write protection circuit according to claim 1, wherein the switch is a physical switch element, the switch is operated in the turned on state when the switch is actuated.

10. The write protection circuit according to claim 1, wherein the switch is connected to a second resistor in parallel.

* * * * *